(12) United States Patent
Yoshikawa

(10) Patent No.: US 10,962,411 B2
(45) Date of Patent: Mar. 30, 2021

(54) PHOTOELECTRIC CONVERSION ELEMENT AND PHOTOELECTRIC CONVERSION DEVICE

(71) Applicant: KANEKA CORPORATION, Osaka (JP)

(72) Inventor: Kunta Yoshikawa, Settsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/809,530

(22) Filed: Mar. 4, 2020

(65) Prior Publication Data

US 2020/0200601 A1 Jun. 25, 2020

Related U.S. Application Data

(63) Continuation of application No. PCT/JP2018/035032, filed on Sep. 21, 2018.

(30) Foreign Application Priority Data

Dec. 14, 2017 (JP) .............................. JP2017-239890

(51) Int. Cl.
*G01J 1/42* (2006.01)
*H01L 31/0216* (2014.01)

(52) U.S. Cl.
CPC ...... *G01J 1/4257* (2013.01); *H01L 31/02161* (2013.01)

(58) Field of Classification Search
CPC ............... H01L 31/056; H01L 31/1868; H01L 31/0204; H01L 31/02161; H01L 31/0216;
(Continued)

(56) References Cited

U.S. PATENT DOCUMENTS 3,962,778 A 6/1976 Palmer
2015/0083212 A1* 3/2015 Beck ................. H01L 31/02008
136/256
(Continued)

FOREIGN PATENT DOCUMENTS

JP H03-272185 A 12/1991
JP 2010-171263 A 8/2010
(Continued)

OTHER PUBLICATIONS

International Search Report issued in PCT/JP2018/035032; dated Nov. 13, 2018.

*Primary Examiner* — Alia Sabur
(74) *Attorney, Agent, or Firm* — Studebaker & Brackett PC

(57) ABSTRACT

A photoelectric conversion element for detecting the spot size of input light. The photoelectric conversion element includes a photoelectric conversion substrate having two main surfaces; a first conductivity-type semiconductor layer and a first electrode layer, which are sequentially laminated on the light receiving surface side, i.e., one main surface, of the photoelectric conversion substrate; and a second conductivity-type semiconductor layer and a second electrode layer, which are sequentially laminated on the rear surface side, i.e., the other main surface, of the photoelectric conversion substrate. The photoelectric conversion element is also provided with an insulating layer that is provided between the photoelectric conversion substrate and the second electrode layer, and the insulating layer has a plurality of through holes that are two-dimensionally provided along the main surface of the photoelectric conversion substrate.

11 Claims, 15 Drawing Sheets

(58) Field of Classification Search
CPC ...... G01J 1/4257; Y02E 10/52; Y02E 10/547; Y02E 10/546; G11B 7/13–131; H01G 9/209
See application file for complete search history.

(56) References Cited

U.S. PATENT DOCUMENTS

2016/0118510 A1* 4/2016 Wu ............... H01L 31/1804
                                                136/256
2019/0006534 A1* 1/2019 Fujita ............ H01L 31/1868

FOREIGN PATENT DOCUMENTS

| JP | 2010-251343 A | 11/2010 |
| JP | 2017-017064 A | 1/2017 |
| JP | 6093061 B2 | 3/2017 |

* cited by examiner

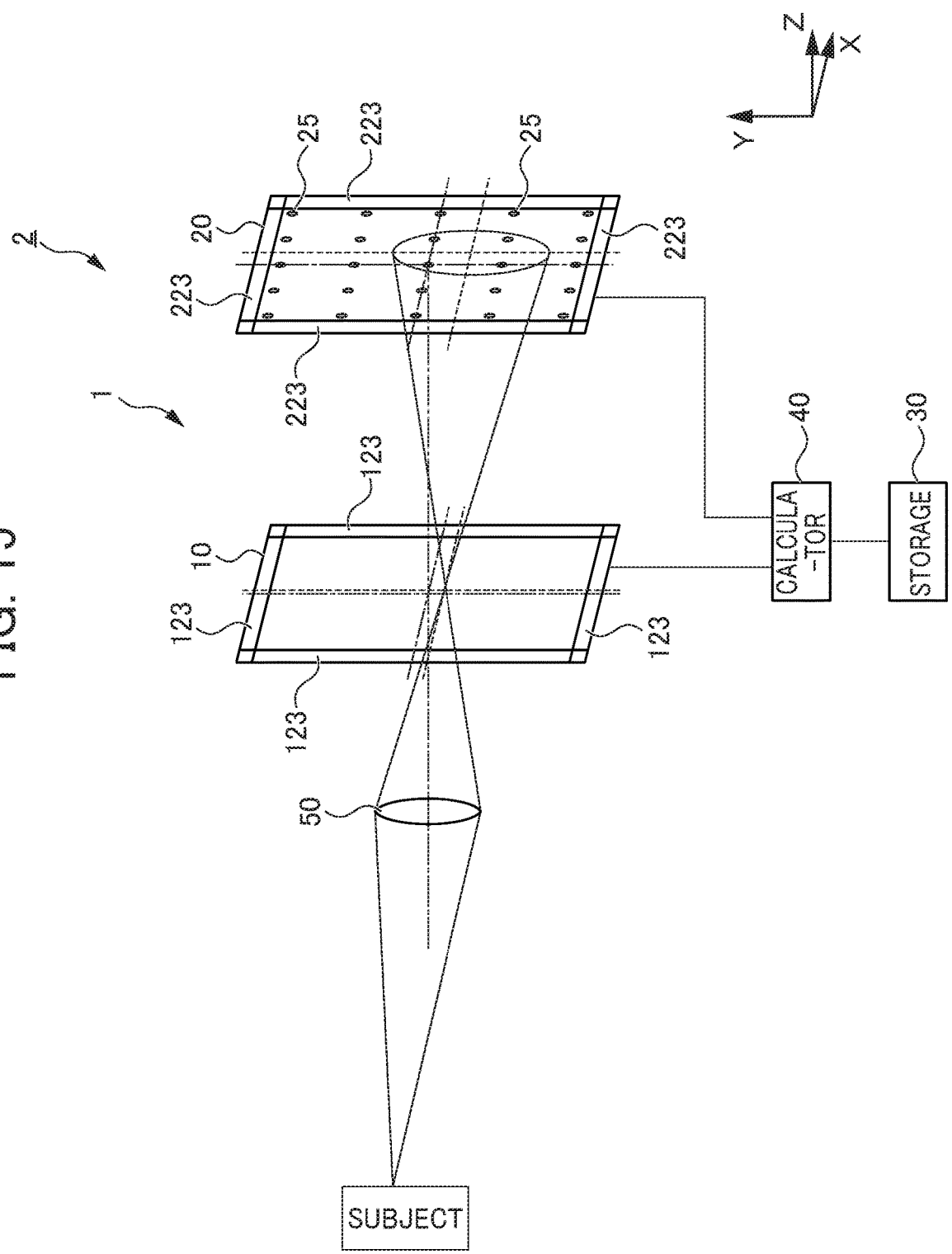

PHOTOELECTRIC CONVERSION ELEMENT AND PHOTOELECTRIC CONVERSION DEVICE

CROSS-REFERENCE TO RELATED APPLICATIONS

This application claims benefit of priority to International Patent Application No. PCT/JP2018/035032, filed Sep. 21, 2018, and to Japanese Patent Application No. 2017-239890, filed Dec. 14, 2017, the entire contents of each are incorporated herein by reference.

BACKGROUND

Technical Field

The present disclosure relates to a photoelectric conversion element and a photoelectric conversion device used in the field of light detection or the like.

Background Art

Japanese Patent No. 6093061 discloses a photoelectric conversion element (semiconductor light receiving element) for detecting the intensity (illuminance) of incident light. An element using a crystalline silicon substrate is, for example, known as such a photoelectric conversion element. In the photoelectric conversion element using the crystalline silicon substrate, a dark current is relatively small and an S/N ratio is relatively high and sensitivity is high (stable response without depending on illuminance) even if the intensity of incident light is low.

SUMMARY

There is a demand for a photoelectric conversion element capable of detecting the spot size of incident light.

Accordingly, the present disclosure provides a photoelectric conversion element and a photoelectric conversion device for detecting the spot size of incident light.

A photoelectric conversion element according to the present disclosure is a photoelectric conversion element including a photoelectric conversion substrate having two principal surfaces, a first conductivity type semiconductor layer and a first electrode layer successively laminated on a light receiving surface side, which is one principal surface of the photoelectric conversion substrate, and a second conductivity type semiconductor layer and a second electrode layer successively laminated on a back surface side, which is the other principal surface of the photoelectric conversion substrate. The photoelectric conversion element further includes an insulating layer provided in at least one of a part between the photoelectric conversion substrate and the first electrode layer and a part between the photoelectric conversion substrate and the second electrode layer, and the insulating layer has a plurality of through-holes two-dimensionally provided along the principal surfaces of the photoelectric conversion substrate.

A photoelectric conversion device according to the present disclosure includes a first photoelectric conversion element arranged on an upstream side of incident light, and the above photoelectric conversion element arranged on a downstream side of the incident light and serving as a second photoelectric conversion element.

According to the present disclosure, it is possible to provide a photoelectric conversion element and a photoelectric conversion device for detecting the spot size of incident light.

BRIEF DESCRIPTION OF THE DRAWINGS

FIG. 15 is a view showing the configuration of a three-dimensional sensor according to a second embodiment.

DETAILED DESCRIPTION

Embodiments of the present disclosure will be described with reference to the accompanying drawings below. Same or corresponding parts shall be denoted by the same reference numbers in each drawing. For the sake of convenience, hatching, member reference numbers, etc. may be omitted. However, in such cases, other drawings shall be referred to.

(First Embodiment)

Figure 1:
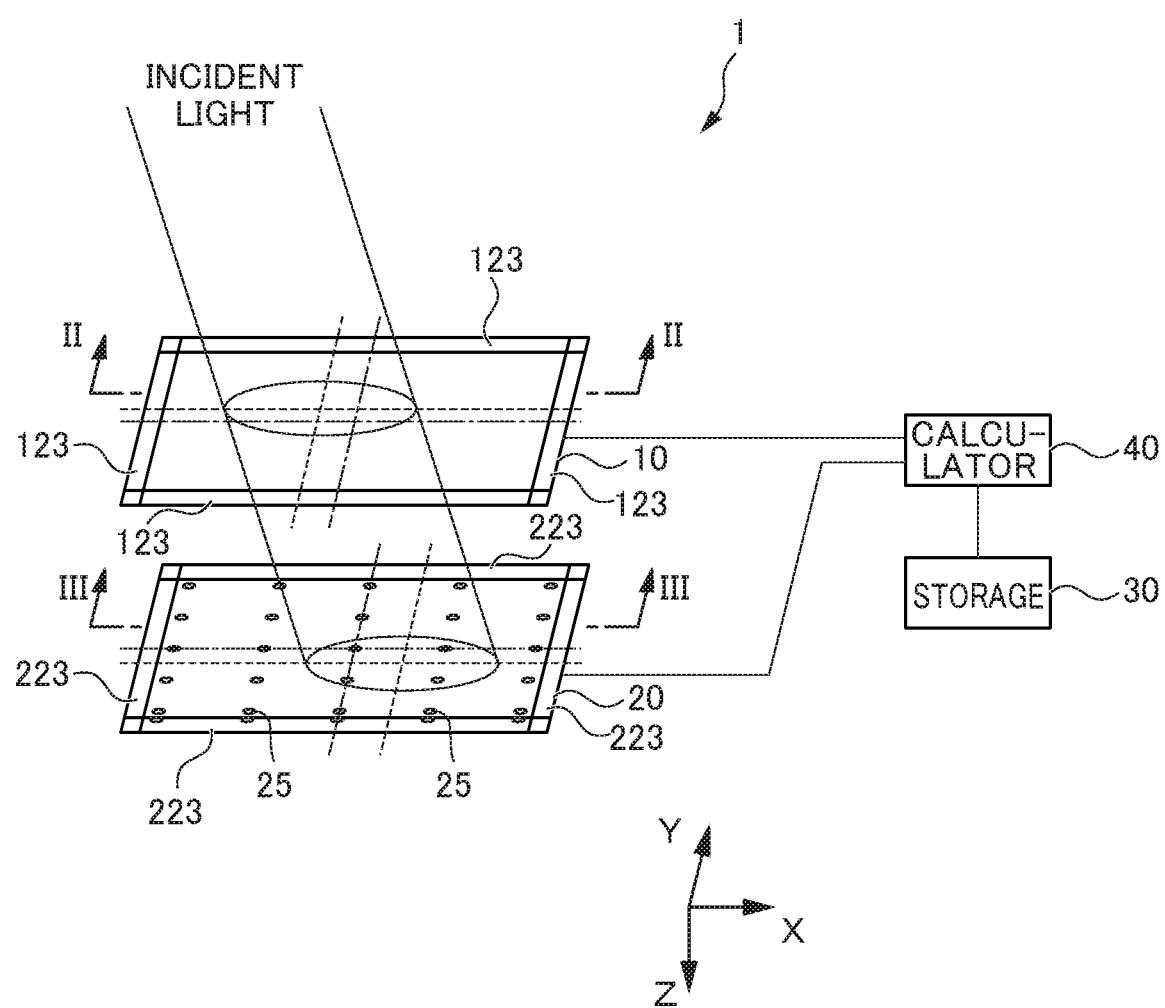
FIG. 1 is a view showing the configuration of a photoelectric conversion device according to a first embodiment.

FIG. 1 is a view showing the configuration of a photoelectric conversion device according to a first embodiment. The photoelectric conversion device 1 shown in FIG. 1 detects not only the intensity of incident light but also the spot size and incident direction of the incident light. The photoelectric conversion device 1 includes a first photoelectric conversion element 10 arranged on an upstream side in a light propagation direction, a second photoelectric conversion element 20 arranged on a downstream side in the light propagation direction, a storage 30 and a calculator 40.

An XYZ orthogonal coordinate system is shown in FIG. 1 and figures to be described later. An XY plane is a plane parallel to light receiving surfaces of the first photoelectric conversion element 10 and the second photoelectric conversion element 20 and a Z direction is a direction orthogonal to the XY plane.

In FIG. 1 and the figures to be described later, an intersection of two dashed-dotted lines in a plan view indicates a center of the XY plane; one dashed-dotted line is parallel to an X direction and the other dashed-dotted line is parallel to a Y direction. An intersection of two dotted lines in the plan view indicates a center of the spot size of incident light on the XY plane; one dotted line is parallel to the X direction and the other dotted line is parallel to the Y direction.

The first photoelectric conversion element 10 generates a current corresponding to the intensity (total amount) of incident light incident on the light receiving surface. The first photoelectric conversion element 10 distributes and outputs the generated current to four electrode layers 123 (and electrode layers 133 on a back surface side to be described later) arranged on four sides according to a center position (coordinates) (hereinafter, also referred to as an XY position) of the incident light on the light receiving surface (XY plane). The first photoelectric conversion element 10 also transmits the incident light. The configuration of the first photoelectric conversion element 10 is described in detail later.

The second photoelectric conversion element 20 generates a current corresponding to a carrier amount passing through a plurality of two-dimensionally provided pin holes (through-holes) 25 out of carriers (electrons or holes) generated according to incident light incident on the light receiving surface. In this way, the second photoelectric conversion element 20 generates a current corresponding to the density of the incident light, i.e. a current corresponding to the spot size of the incident light (to be described in detail later). The second photoelectric conversion element 20 distributes and outputs the generated current to four electrode layers 223 (and electrode layers 233 on a back surface side to be described later) arranged on four sides according to a center position (coordinates) (hereinafter, also referred to as an XY position) of the incident light on the light receiving surface (XY plane). The configuration of the second photoelectric conversion element 20 is described in detail later. In FIG. 1, the plurality of pin holes 25 in an insulating layer to be described later are transparently shown in the second photoelectric conversion element 20.

The storage 30 stores in advance a table associating an output current (total amount) of the first photoelectric conversion element 10 (i.e. a current corresponding to the intensity (total amount) of incident light) and an output current (total amount) of the second photoelectric conversion element 20 (i.e. a current corresponding to the spot size of the incident light) with the spot size of the incident light on the light receiving surface of the second photoelectric conversion element 20. The storage 30 is a rewritable memory such as an EEPROM.

The calculator 40 calculates and detects the intensity (total amount) of the incident light according to the total amount of currents output from the four electrode layers 123 (133) of the first photoelectric conversion element 10.

The calculator 40 also calculates and detects the XY position (coordinates) of the incident light on the light receiving surface of the first photoelectric conversion element 10 based on a ratio of the currents output from each of the four electrode layers 123 (133) of the first photoelectric conversion element 10. The calculator 40 also calculates and detects the XY position (coordinates) of the incident light on the light receiving surface of the second photoelectric conversion element 20 based on a ratio of the currents output from each of the four electrode layers 223 (233) of the second photoelectric conversion element 20. The calculator 40 calculates and detects an incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30 and obtains and detects the spot size of the incident light on the light receiving surface of the second photoelectric conversion element 20 corresponding to the total amount of the currents output from the four electrode layers 123 (133) of the first photoelectric conversion element 10 (i.e. a current corresponding to the intensity (total amount) of the incident light) and the total amount of the currents output from the four electrode layers 223 (233) of the second photoelectric conversion element 20 (i.e. a current corresponding to the spot size of the incident light).

The calculator 40 is constituted by an arithmetic processor such as a DSP (Digital Signal Processor) or an FPGA (Field-Programmable Gate Array). Various functions of the calculator 40 are realized, for example, by executing a predetermined software (program, application) stored in the storage 30. Various functions of the calculator 40 may be realized by the cooperation of a hardware and a software or may be realized only by a hardware (electronic circuit). The configurations of the first photoelectric conversion element 10 and the second photoelectric conversion element 20 are described in detail below.

<First Photoelectric Conversion Element>

Figure 2:
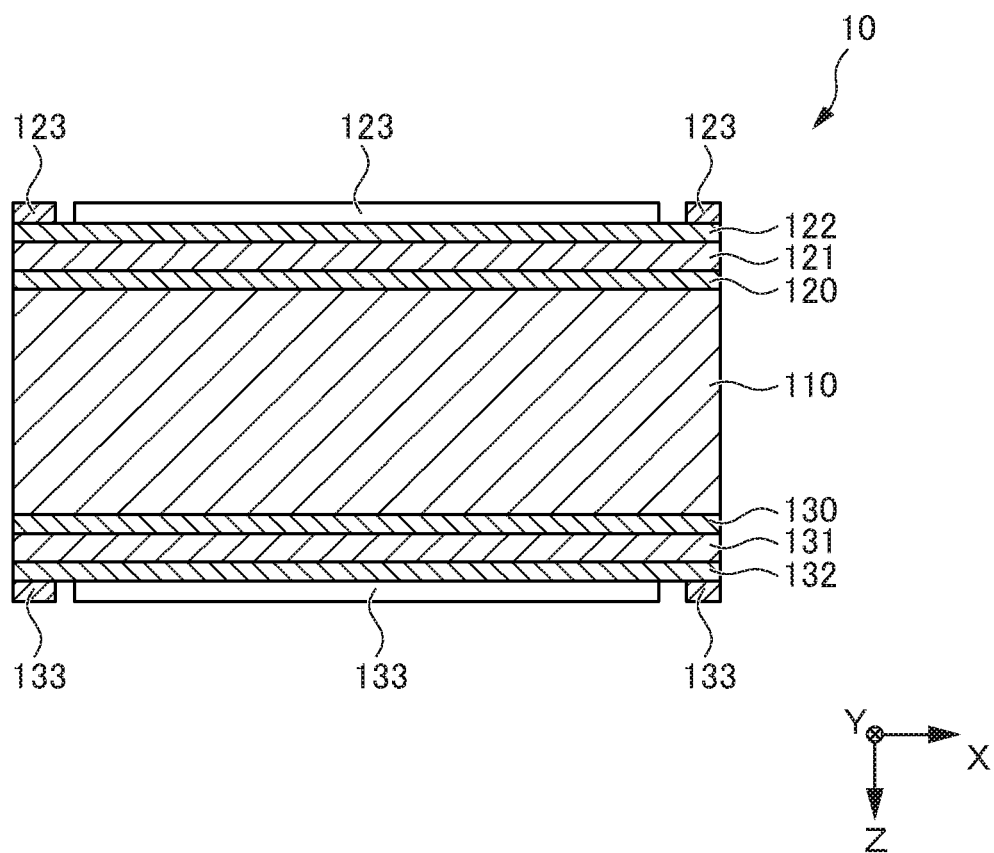
FIG. 2 is a sectional view along line II-II in a first photoelectric conversion element of FIG. 1.

FIG. 2 is a sectional view along line II-II of the first photoelectric conversion element 10 of FIG. 1. The first photoelectric conversion element 10 is provided with an n-type (second conductivity type) semiconductor substrate (photoelectric conversion substrate) 110 having two principal surfaces, and a passivation layer 120, a p-type (first conductivity type) semiconductor layer 121, a transparent electrode layer 122 and the electrode layers 123 successively laminated on the light receiving surface side, which is one principal surface on a light receiving side, out of the principal surfaces of the semiconductor substrate 110. The first photoelectric conversion element 10 is also provided with a passivation layer 130, an n-type (second conductivity type) semiconductor layer 131, a transparent electrode layer 132 and the electrode layers 133 successively laminated on a part of a back surface side, which is the other principal surface on a side opposite to the light receiving side, out of the principal surfaces of the semiconductor substrate 110.

The semiconductor substrate (photoelectric conversion substrate) 110 is formed of a crystalline silicon material such as single-crystal silicon or multi-crystal silicon. The semiconductor substrate 110 is, for example, an n-type semiconductor substrate in which the crystalline silicon material is doped with an n-type dopant. An example of the n-type dopant may include phosphorus (P). By using the crystalline silicon as the material of the semiconductor substrate 110, a dark current is relatively small, and an S/N ratio is relatively high and sensitivity is high (stable response without depending on illuminance) even if the intensity of the incident light is low.

The passivation layer 120 is formed on the light receiving surface side of the semiconductor substrate 110, and the passivation layer 130 is formed on the back surface side of the semiconductor substrate 110. The passivation layers 120, 130 are, for example, formed of an intrinsic (i-type) amorphous silicon material. The passivation layers 120, 130 suppress the recombination of carriers generated in the semiconductor substrate 210 and enhance carrier recovery efficiency.

The p-type semiconductor layer 121 is formed on the passivation layer 120. The p-type semiconductor layer 121 is, for example, formed of an amorphous silicon material. The p-type semiconductor layer 121 is, for example, a p-type semiconductor layer in which the amorphous silicon material is doped with a p-type dopant. An example of the p-type dopant may include boron (B).

The n-type semiconductor layer 131 is formed on the passivation layer 130. The n-type semiconductor layer 131 is, for example, formed of an amorphous silicon material. The n-type semiconductor layer 131 is, for example, an n-type semiconductor layer in which the amorphous silicon material is doped with an n-type dopant (e.g. phosphorus (P) described above). The aforementioned passivation layers 120, 130, p-type semiconductor layer 121 and n-type semiconductor layer 131 are formed, for example, using a CVD method.

The transparent electrode layer 122 is formed on the p-type semiconductor layer 121, and the transparent electrode layer 132 is formed on the n-type semiconductor layer 131. The transparent electrode layers 122, 132 are formed of a transparent conductive material. ITO (Indium Tin Oxide: complex oxide of indium oxide and tin oxide) or the like is given as an example of the transparent conductive material. The transparent electrode layers 122, 132 are formed, for example, using a sputtering method.

Four electrode layers 123 are independently formed on the respective four sides on the transparent electrode layer 122, and four electrode layers 133 are independently formed on the respective four sides on the transparent electrode layer 132. The electrode layers 123, 133 are formed of a conductive paste material containing metal powder such as silver powder. The electrode layers 123, 133 are formed, for example, using a printing method.

<Second Photoelectric Conversion Element>

Figure 3:
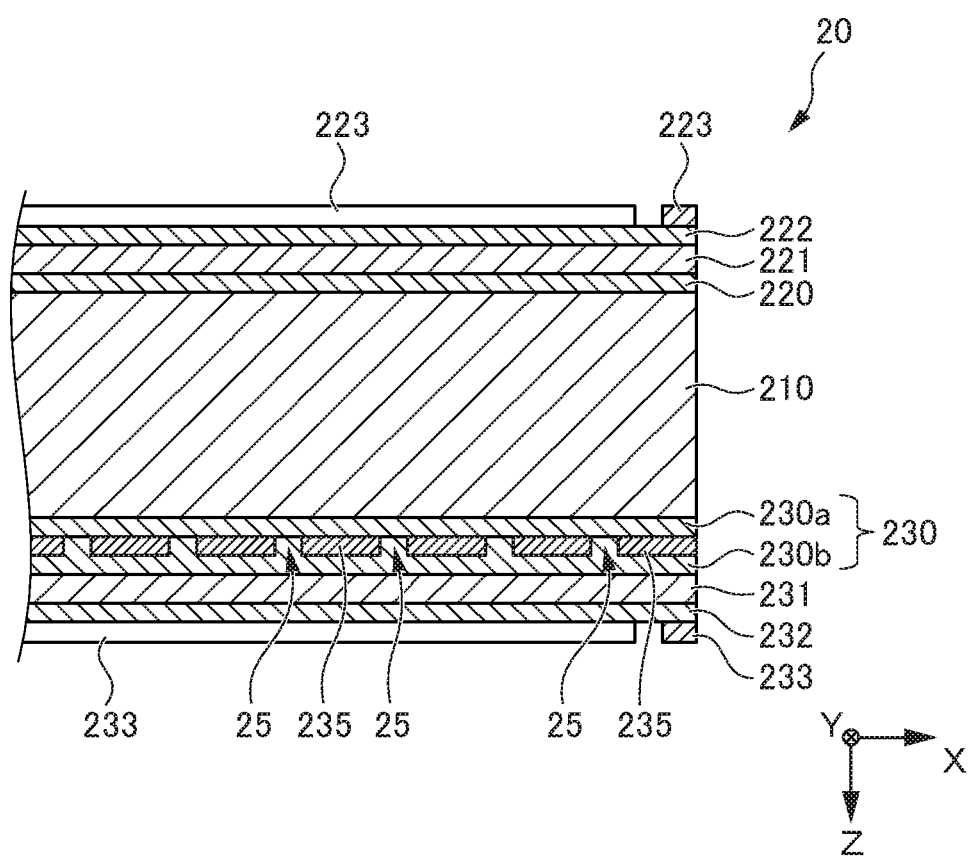
FIG. 3 is a partial sectional view along line in a second photoelectric conversion element of FIG. 1.
Figure 4:
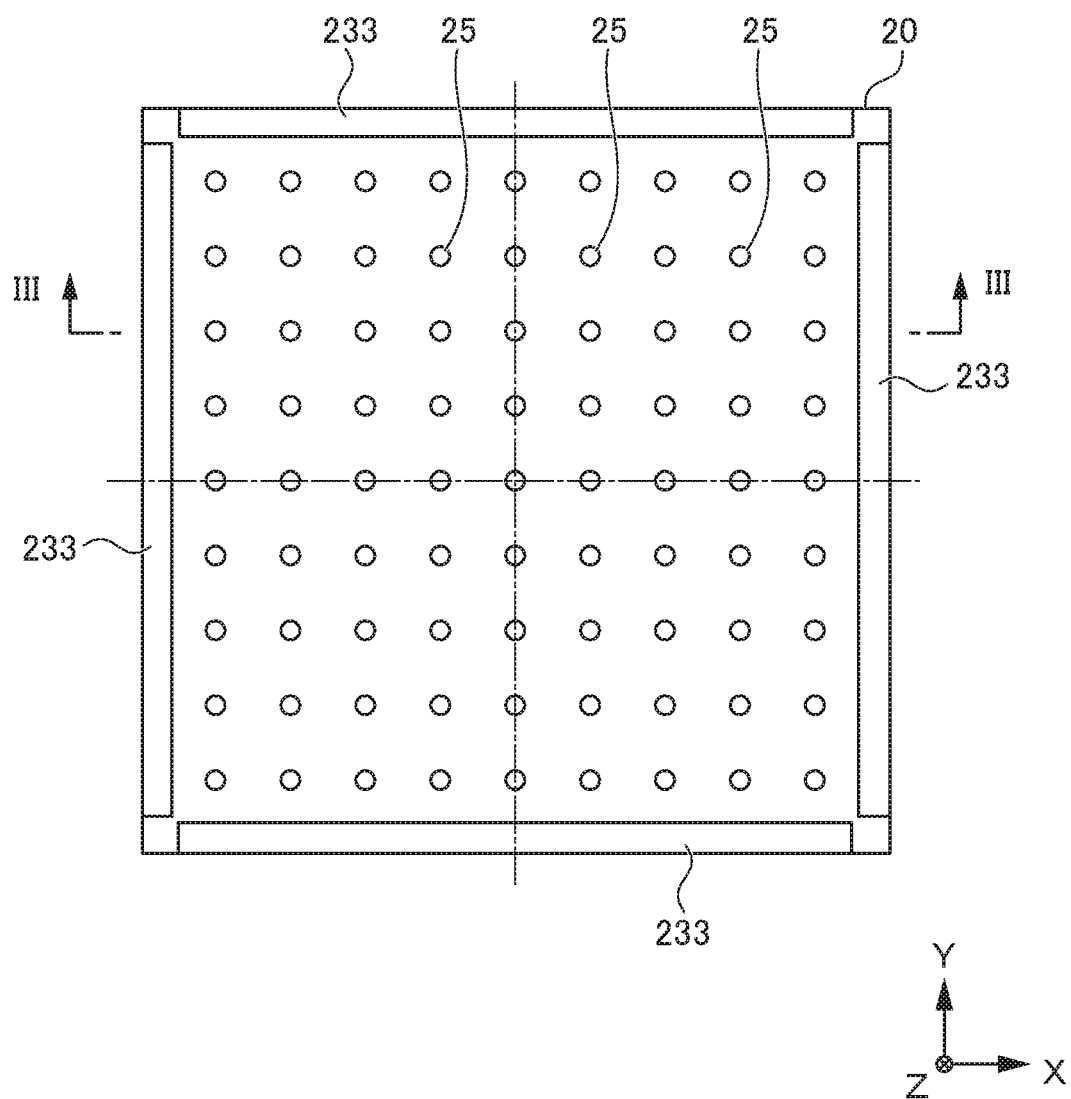
FIG. 4 is a view showing layers on the back surface side of a semiconductor substrate of the second photoelectric conversion element of FIGS. 1 and 3 from the light receiving surface side.

FIG. 3 is a partial sectional view along line of the second photoelectric conversion element 20 of FIG. 1. FIG. 4 is a view showing layers 230, 231, 232, 233 and 235 on the back surface side of a semiconductor substrate 210 of the second photoelectric conversion element 20 of FIGS. 1 and 3 from the light receiving surface side. In FIG. 4, the plurality of pin holes 25 in the insulating layer 235 are transparently shown. As shown in FIG. 3, the second photoelectric conversion element 20 is provided with an n-type (second conductivity type) semiconductor substrate (photoelectric conversion substrate) 210 having two principal surfaces, and a passivation layer (first passivation layer) 220, a p-type (first conductivity type) semiconductor layer 221, a transparent electrode layer (first electrode layer) 222 and the electrode layer 223 successively laminated on the light receiving surface side, which is one principal surface on a light receiving side, out of the principal surfaces of the semiconductor substrate 210. The second photoelectric conversion element 20 is also provided with a passivation layer (second passivation layer) 230, an n-type (second conductivity type) semiconductor layer 231, a transparent electrode layer (second electrode layer) 232 and the electrode layer 233 successively laminated on a back surface side, which is the other principal surface on a side opposite to the light receiving surface, out of the principal surfaces of the semiconductor substrate 210. The second photoelectric conversion element 20 is further provided with the insulating layer 235 laminated in an intermediate part of the passivation layer 230 in the lamination direction of the layers 230, 231, 232 and 233 on the back surface side of the semiconductor substrate 210.

The semiconductor substrate (photoelectric conversion substrate) 210 is formed of a crystalline silicon material such as single-crystal silicon or multi-crystal silicon similarly to the semiconductor substrate 110 of the aforementioned first photoelectric conversion element 10. The semiconductor substrate 210 is, for example, an n-type semiconductor substrate in which the crystalline silicon material is doped with an n-type dopant (e.g. phosphorus (P) described above). By using the crystalline silicon as the material of the semiconductor substrate 210, a dark current is relatively small, and an S/N ratio is relatively high and sensitivity is high (stable response without depending on illuminance) even if the intensity of the incident light is low.

The passivation layer 220 is formed on the light receiving surface side of the semiconductor substrate 210, and the passivation layer 230 is formed on the back surface side of the semiconductor substrate 210. The passivation layers 220, 230 are, for example, formed of an intrinsic (i-type) amorphous silicon material similarly to the passivation layers 120, 130 of the aforementioned first photoelectric conversion element 10. The passivation layers 220, 230 suppress the recombination of carriers generated in the semiconductor substrate 210 and enhance carrier recovery efficiency.

The p-type semiconductor layer 221 is formed on the passivation layer 220. The p-type semiconductor layer 221 is, for example, formed of an amorphous silicon material similarly to the p-type semiconductor layer 121 of the aforementioned first photoelectric conversion element 10. The p-type semiconductor layer 221 is, for example, a p-type semiconductor layer in which the amorphous silicon material is doped with a p-type dopant (e.g. boron (B) described above).

The n-type semiconductor layer 231 is formed on the passivation layer 230. The n-type semiconductor layer 231 is, for example, formed of an amorphous silicon material similarly to the n-type semiconductor layer 131 of the aforementioned first photoelectric conversion element 10. The n-type semiconductor layer 231 is, for example, an n-type semiconductor layer in which the amorphous silicon material is doped with an n-type dopant (e.g. phosphorus (P) described above). The aforementioned passivation layers 220, 230, p-type semiconductor layer 221 and n-type semiconductor layer 231 are formed, for example, using a CVD method.

The transparent electrode layer 222 is formed on the p-type semiconductor layer 221, and the transparent electrode layer 232 is formed on the n-type semiconductor layer 231. The transparent electrode layers 222, 232 are formed of a transparent conductive material similarly to the transparent electrode layers 122, 132 of the aforementioned first photoelectric conversion element 10. The transparent electrode layers 222, 232 are formed, for example, using a sputtering method.

Four electrode layers 223 are independently formed on the respective four sides on the transparent electrode layer 222, and four electrode layers 233 are independently formed on the respective four sides on the transparent electrode layer 232. The electrode layers 223, 233 are formed of a conductive paste material containing metal powder such as silver powder, similarly to the electrode layers 123, 133 of the aforementioned first photoelectric conversion element 10. The electrode layers 223, 233 are formed, for example, using a printing method.

The insulating layer 235 is formed in an intermediate part of the passivation layer 230, for example, between a division layer 230a and a division layer 230b that are two layers into which the passivation layer 230 is divided. The insulating layer 235 is formed of an insulating and transparent material such as SiNx, SiOx, AlOx, TiOx or TiNx. As shown in FIGS. 3 and 4, the insulating layer 235 has the plurality of pin holes 25 two-dimensionally provided along the principal surfaces of the semiconductor substrate 210, and these pin holes 25 are filled with the material of the passivation layer 230. Although the pin holes 25 are arranged at equal intervals on the intersection point of an orthogonal grid as an example of the arrangement of the pin holes 25 in this embodiment, the arrangement of the pin holes 25 is not limited to this. For example, the pin holes 25 may be arranged in a staggered form. In other words, the pin holes 25 adjacent in the Y direction (or X direction) may be arranged to be staggered in the X direction (or Y direction). Although a circular shape in a plan view along the principal surfaces of the semiconductor substrate 210 is shown as an example of the shape of the pin hole 25 in this embodiment, the shape of the pin hole 25 is not limited to this. For example, the pin hole 25 may be elliptical or polygonal.

The pin hole 25 is preferably smaller in diameter, and larger in number. Thus, a change in the output current of the second photoelectric conversion element 20 according to the spot size of incident light becomes greater. For example, the diameter of the pin hole 25 is preferably 5 μm or more and 50 μm or less (i.e., from 5 μm to 50 μm), and still preferably approximately 10 μm. The interval (center interval) between the pin holes 25 is preferably 50 μm or more and 500 μm or less (i.e., from 50 μm to 500 μm), and still preferably approximately 100 μm. A ratio of the total area of the pin holes 25 to the area of the light receiving surface of the second photoelectric conversion element 20 (more specifically, the area of the p-type semiconductor layer 221 and the n-type semiconductor layer 231 is preferably 0.005% or more and 5% or less (i.e., from 0.005% to 5%), and still preferably approximately 0.1%.

The insulating layer 235 and the pin holes 25 are formed, for example, using a photolithographic method. For example, after an insulating layer is formed on the division layer 230a in the passivation layer 230, the pin holes (through-holes) 25 passing through the insulating layer are formed, and the insulating layer 235 is obtained. After this, the division layer 230b in the passivation layer 230 is formed on the insulating layer 235. Thus, the pin holes 25 are filled with the material of the passivation layer 230.

Thus, as an irradiation region R (see FIG. 5) irradiated with incident light on the principal surface decreases (i.e. as the density of the incident light increases), the number of the pin holes 25 in the irradiation region R decreases. Therefore, the output current decreases as the spot size of the incident light on the light receiving surface decreases. This is described in detail below.

Figure 5:
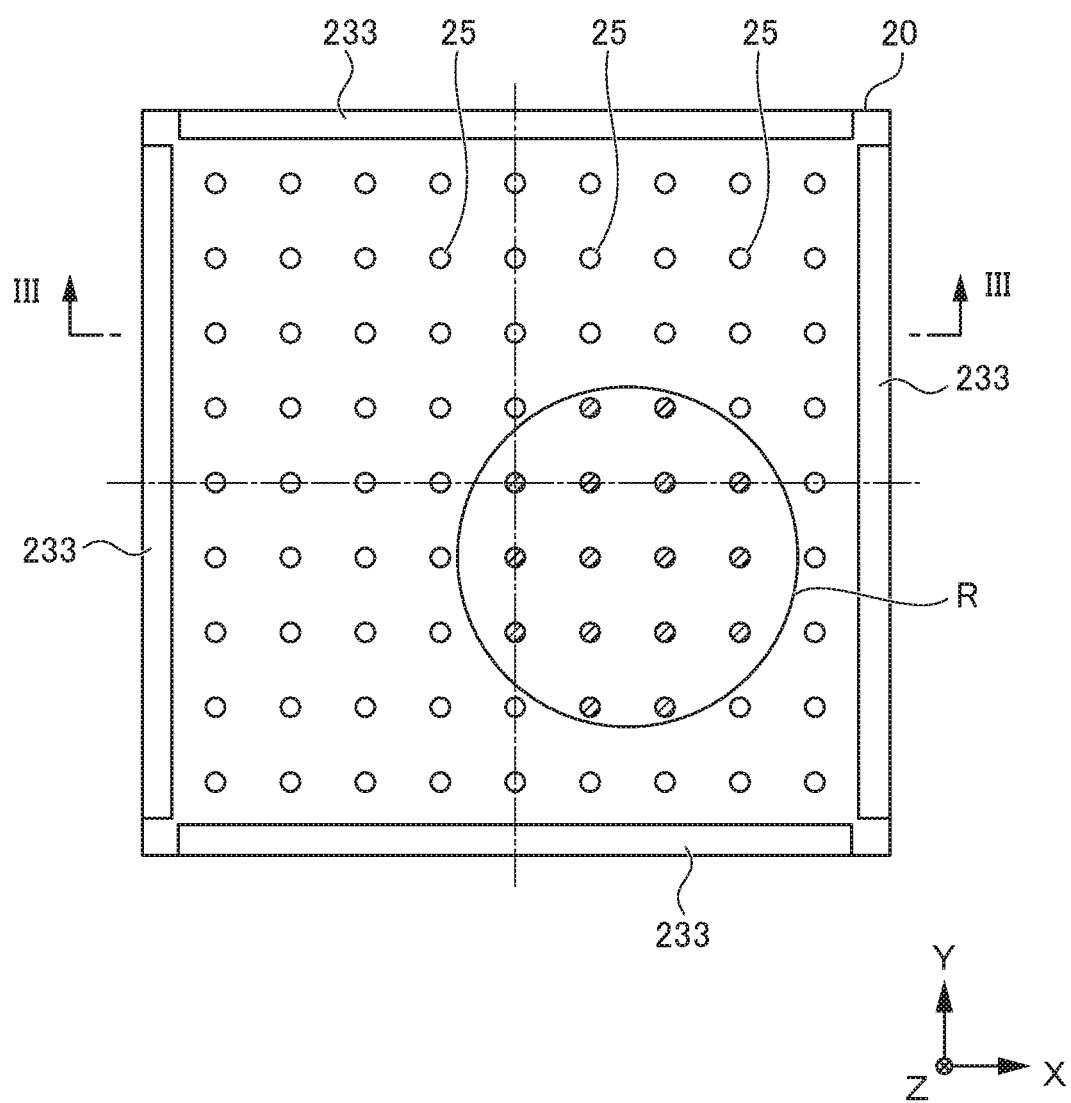
FIG. 5 is a view showing a state where incident light is incident on the second photoelectric conversion element of FIG. 4.
Figure 6:
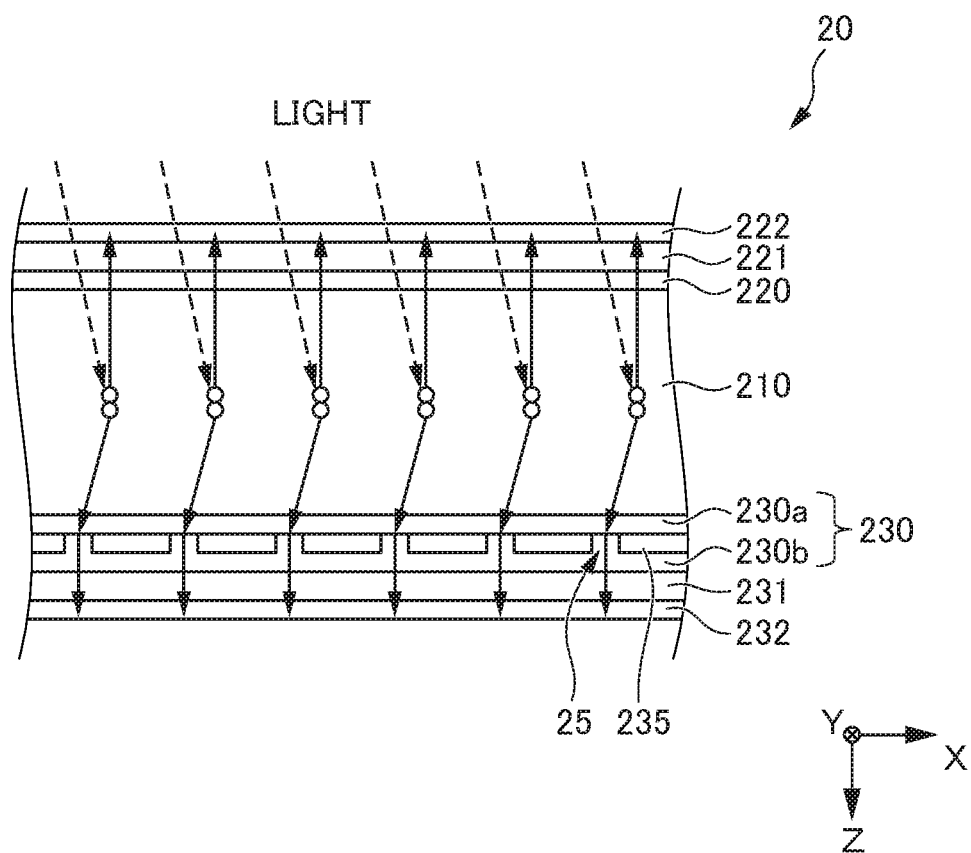
FIG. 6 is a schematic view showing the state of the recovery of carriers generated in a semiconductor substrate when an irradiation region shown in FIG. 5 is large.
Figure 7:
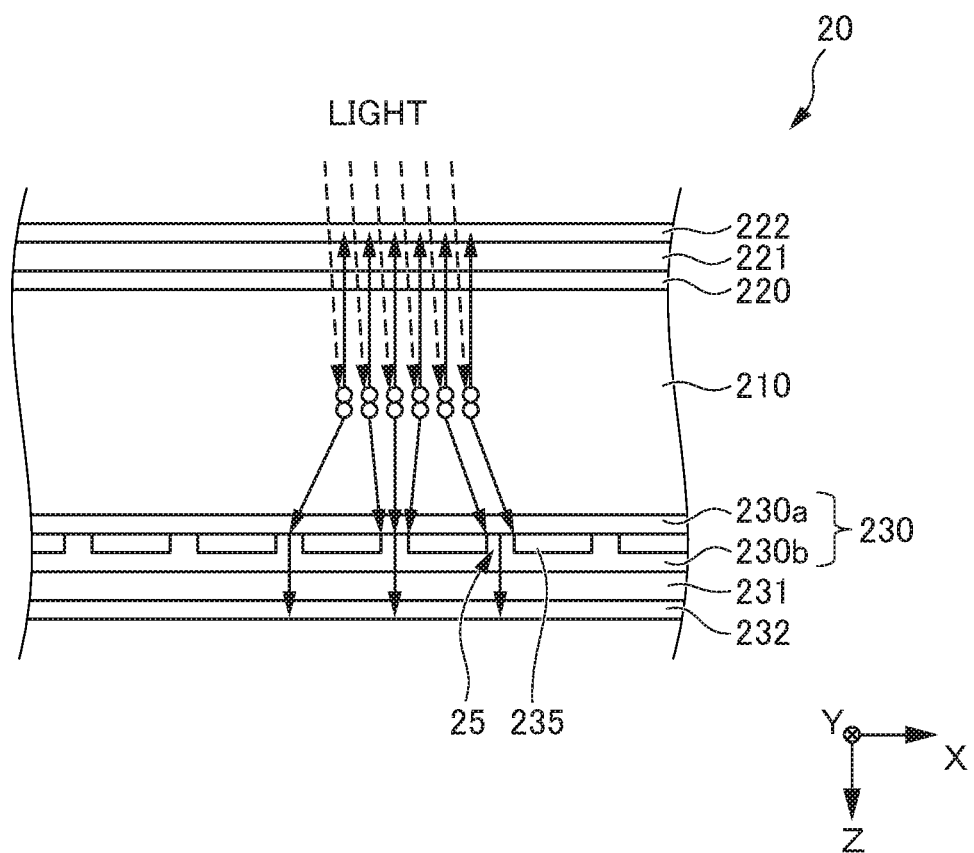
FIG. 7 is a schematic view showing the state of the recovery of carriers generated in a semiconductor substrate when an irradiation region shown in FIG. 5 is small.

FIG. 6 is a schematic view showing the state of the recovery of carriers generated in the semiconductor substrate 210 when the irradiation region R shown in FIG. 5 is large. FIG. 7 is a schematic view showing the state of the recovery of carriers generated in the semiconductor substrate 210 when the irradiation region R shown in FIG. 5 is small. In FIGS. 6 and 7, the state of the incidence of incident light is indicated by broken-line arrows. In FIGS. 6 and 7, carriers (electrons and holes) generated in the semiconductor substrate 210 are indicated by circular marks, and the movement state of the carriers is indicated by solid-line arrows. As shown in FIGS. 6 and 7, the carriers (holes) generated in the semiconductor substrate 210 are recovered by the p-type semiconductor layer 221 via the passivation layer 220, and extracted by the transparent electrode layer 222. On the other hand, the carriers (electrons) generated in the semiconductor substrate 210 are recovered by the n-type semiconductor layer 231 via the passivation layer 230, and extracted by the transparent electrode layer 232. In this instance, the carriers (electrons) are blocked by the insulating layer 235 provided in an intermediate part of the passivation layer 230, and pass through only the pin holes 25.

When the irradiation region R is large as shown in FIG. 6, the number of the pin holes 25 in the irradiation region R is large, and overall resistance of a current path formed by the pin holes 25 becomes substantially low. On the other hand, when the irradiation region R is small as shown in FIG. 7, the number of the pin holes 25 in the irradiation region R is small, and overall resistance of a current path formed by the pin holes 25 becomes substantially high. Thus, as the irradiation region R decreases (i.e. as the density of incident light becomes higher), resistance substantially increases. Therefore, the output current decreases as the spot size of the incident light on the light receiving surface decreases.

In other words, when the density of incident light is low, i.e., the density of carriers generated in the semiconductor substrate 210 is low as shown in FIG. 6, most of the carriers (electrons) are dispersed into the pin holes 25, and are not congested in the pin holes 25. On the other hand, when the density of incident light is high, i.e., the density of carriers generated in the semiconductor substrate 210 is high as shown in FIG. 7, the carriers (electrons) are concentrated in a small number of the pin holes 25, and are congested in the pin holes 25. Thus, the output current decreases as the irradiation region R decreases (i.e. as the density of incident light becomes higher), i.e., as the spot size of the incident light on the light receiving surface decreases.

In this embodiment, the insulating layer 235 is provided in an intermediate part of the passivation layer 230 having the highest resistance out of the passivation layer 230, the n-type semiconductor layer 231 and the transparent electrode layer 232 on the back surface side of the second photoelectric conversion element 20, and the pin holes 25 in the insulating layer 235 are filled with the material of the passivation layer 230 and has high resistance. Thus, a change in the output current of the second photoelectric conversion element 20 according to the spot size of incident light becomes greater.

An insulating layer having pin holes is not formed on the light receiving surface of the second photoelectric conversion element 20. Thus, optical characteristics (e.g. reflection characteristic) become uniform on the light receiving surface side of the second photoelectric conversion element 20.

As described above, the first photoelectric conversion element 10 generates a current corresponding to the intensity (total amount) of incident light incident on the light receiving surface in the photoelectric conversion device 1 according to this embodiment. The first photoelectric conversion element 10 distributes and outputs the generated current to four pairs of the electrode layers 123, 133 arranged on the four sides according to the XY position (coordinates) of the center of the incident light on the light receiving surface (XY plane). The second photoelectric conversion element 20 generates a current corresponding to a carrier amount passing through the plurality of pin holes (through-holes) 25 out of carriers (electrons or holes) generated according to incident light incident on the light receiving surface. In this way, the second photoelectric conversion element 20 generates a current corresponding to the density of the incident light, i.e. a current corresponding to the spot size of the incident light. The second photoelectric conversion element 20 distributes and outputs the generated current to the four pairs of the electrode layers 223, 233 arranged on four sides according to the XY position (coordinates) of the center of the incident light on the light receiving surface (XY plane).

The calculator 40 calculates and detects the intensity (total amount) of the incident light according to the total amount of the currents output from the four pairs of the electrode layers 123, 133 of the first photoelectric conversion element 10.

The calculator 40 also calculates and detects the XY position (coordinates) of the incident light on the light receiving surface of the first photoelectric conversion element 10 based on a ratio of the currents respectively output from the four pairs of the electrode layers 123, 133 of the first photoelectric conversion element 10. Similarly, the calculator 40 calculates and detects the XY position (coordinates) of the incident light on the light receiving surface of the second photoelectric conversion element 20 based on a ratio of the currents respectively output from the four pairs of the electrode layers 223, 233 of the second photoelectric conversion element 20. The calculator 40 calculates and detects an incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 refers to the table stored in the storage 30 and obtains and detects the spot size of the incident light on the light receiving surface of the second photoelectric conversion element 20 corresponding to the total amount of the currents output from four pairs of the electrode layers 123, 133 of the first photoelectric conversion element 10 (i.e. currents corresponding to the intensity (total amount) of the incident light) and the total amount of the currents output from the four pairs of the electrode layers 223, 233 of the second photoelectric conversion element 20 (i.e. currents corresponding to the intensity of the spot size of the incident light.

When the intensity of the incident light is already known, the spot size of the incident light on the light receiving surface of the second photoelectric conversion element 20 can be detected even by the second photoelectric conversion element 20 alone without using the first photoelectric conversion element 10. For example, the storage 30 associates, on the table, the intensity of the incident light instead of an output current (total amount) of the first photoelectric conversion element 10. The calculator 40 may obtain the spot size of the incident light on the light receiving surface of the second photoelectric conversion element 20 from the intensity of the incident light and the total amount of the currents output from the second photoelectric conversion element 20.

Figure 8:
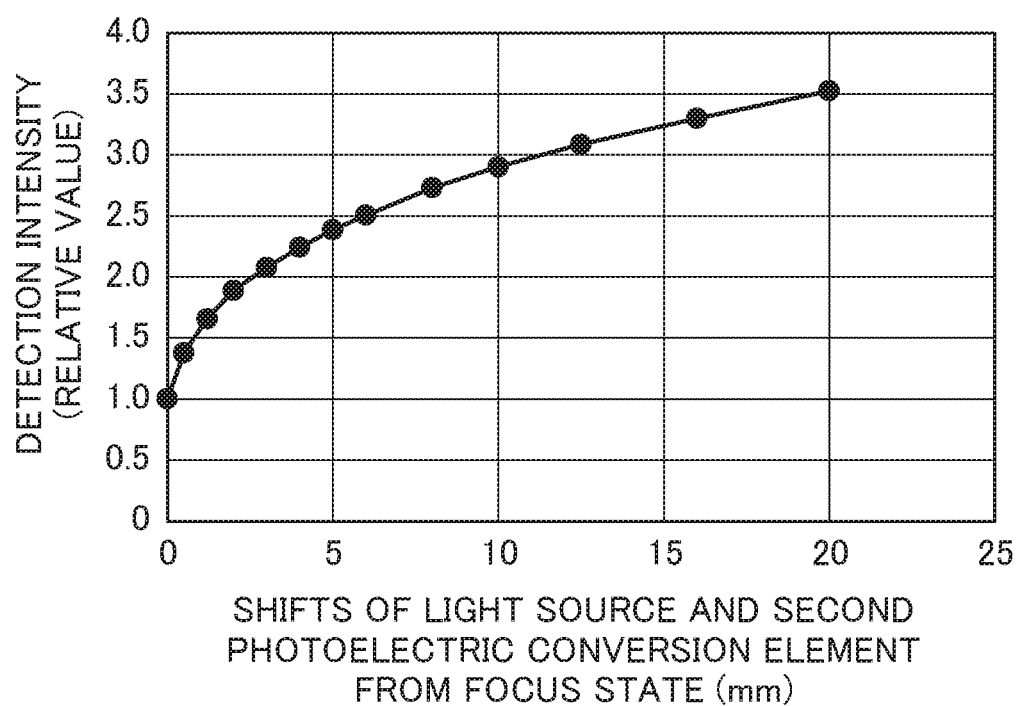
FIG. 8 is a graph showing an example of detection intensities (relative values) of the incident light with the second photoelectric conversion element when a light source is moved away from the second photoelectric conversion element from a state where the incident light from the light source is focused on the light receiving surface of the second photoelectric conversion element (0 mm on a horizontal axis)

FIG. 8 is a graph showing an example of detection intensities (relative values) of the incident light with the second photoelectric conversion element 20 when a light source is moved away from the second photoelectric conversion element 20 from a state where the incident light (wavelength of 940 nm) from the light source is focused on the light receiving surface of the second photoelectric conversion element 20 (0 mm on a horizontal axis). FIG. 8 shows a characteristic when the pin holes 25 having a diameter of 10 μm are formed at equal intervals in the insulating layer 235 at the intersection points on an orthogonal grid at a center interval of 100 μm. According to FIG. 8, it is understood that detection intensities of the incident light with the second photoelectric conversion element 20 decrease as the light source is moved closer to the second photoelectric conversion element 20 from a state where the light source is away from the second photoelectric conversion element 20, i.e. as the spot size of the incident light on the light receiving surface of the second photoelectric conversion element 20 decreases.

Although the second photoelectric conversion element 20 in which the insulating layer 235 is arranged in an intermediate part of the passivation layer (second passivation layer) 230 is illustrated in this embodiment, the arrangement of the insulating layer is not limited to this. Several modifications of the arrangement of the insulating layer are shown below.
(First Modification)

Figure 9:
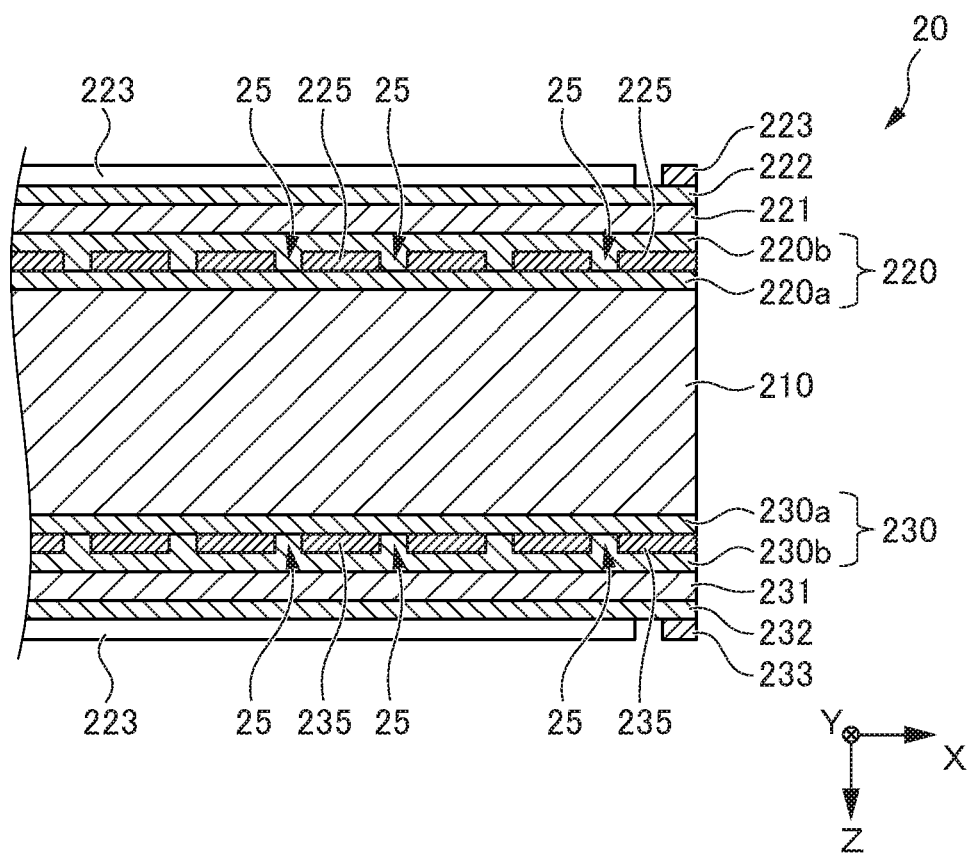
FIG. 9 is a sectional view of a second photoelectric conversion element according to a first modification of the first embodiment.

FIG. 9 is a sectional view of a second photoelectric conversion element according to a first modification of the first embodiment. As shown in FIG. 9, in the second photoelectric conversion element 20, an insulating layer 225 may also be provided in an intermediate part of the passivation layer (first passivation layer) 220 in the lamination direction, on the light receiving surface side of the semiconductor substrate 210. Similarly to the insulating layer 235, the insulating layer 225 is formed in an intermediate part of the passivation layer 220, for example, between a division layer 220a and a division layer 220b that are two layers into which the passivation layer 220 is divided. Similarly to the insulating layer 235, the insulating layer 225 has a plurality of pin holes 25 two-dimensionally provided along the principal surfaces of the semiconductor substrate 210, and these pin holes 25 are filled with the material of the passivation layer 220. Thus, not only substantial resistance on the back surface side of the semiconductor substrate 210 but also substantial resistance on the light receiving surface side changes according to the size of the irradiation region R, and an output current amount changes more.

In the second photoelectric conversion element 20, an insulating layer and pin holes may be provided in at least one of an intermediate part of the passivation layer (second passivation layer) 230 on the back surface side of the semiconductor substrate 210 and an intermediate part of the passivation layer (first passivation layer) 220 on the light receiving surface side of the semiconductor substrate 210.
(Second Modification)

Figure 10:
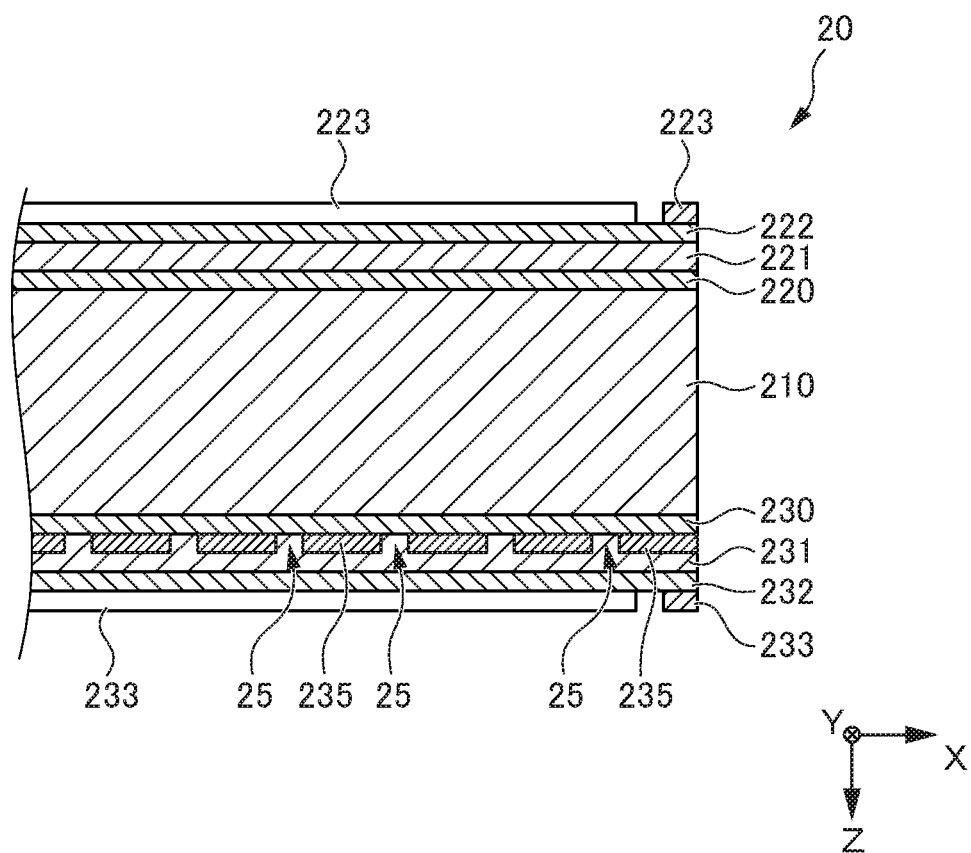
FIG. 10 is a sectional view of a second photoelectric conversion element according to a second modification of the first embodiment.

FIG. 10 is a sectional view of a second photoelectric conversion element according to a second modification of the first embodiment. As shown in FIG. 10, in the second photoelectric conversion element 20, the insulating layer 235 may be provided between the passivation layer (second passivation layer) 230 and the n-type (second conductivity type) semiconductor layer 231. In this case, for example, after an insulating layer is formed on the passivation layer 230, the pin holes 25 are formed, and the insulating layer 235 is obtained. After this, the n-type semiconductor layer 231 is formed on the insulating layer 235. Thus, the pin holes 25 are filled with the material of the n-type semiconductor layer 231.

In the second photoelectric conversion element 20, an insulating layer and pin holes may be provided in at least one of a part between the passivation layer (second passivation layer) 230 on the back surface side of the semiconductor substrate 210 and the n-type (second conductivity type) semiconductor layer 231, and a part between the passivation layer (first passivation layer) 220 on the light receiving surface side of the semiconductor substrate 210 and the p-type (first conductivity type) semiconductor layer 221.

(Third Modification)

Figure 11:
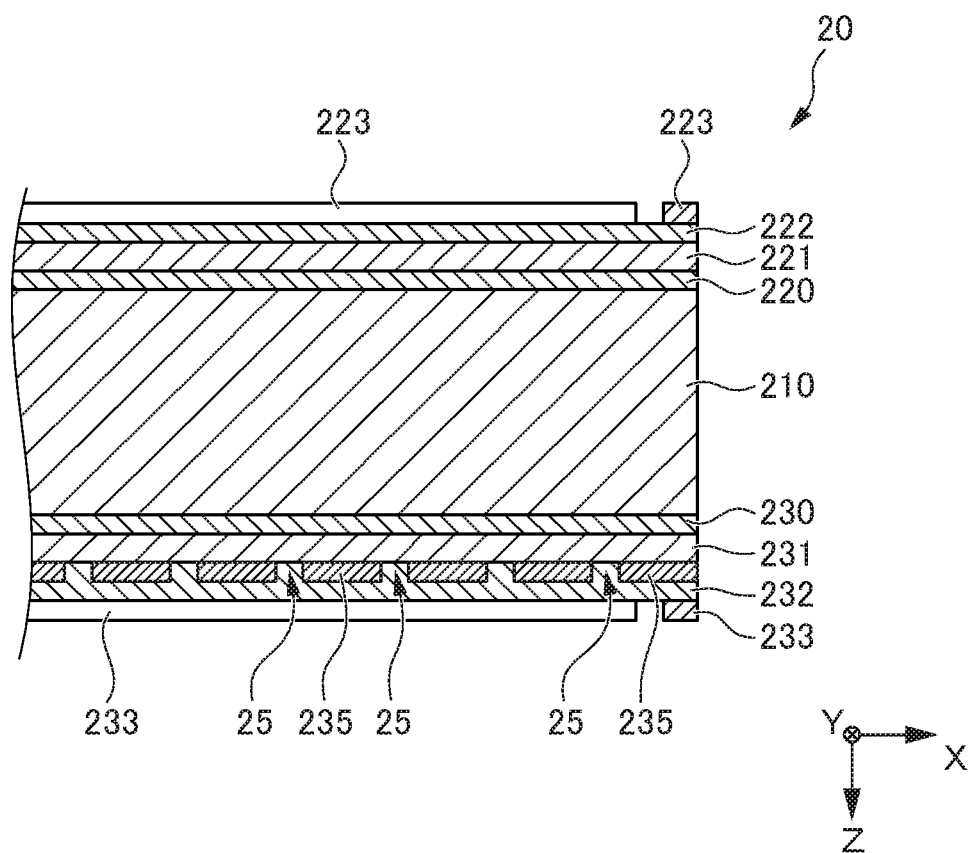
FIG. 11 is a sectional view of a second photoelectric conversion element according to a third modification of the first embodiment.

FIG. 11 is a sectional view of a second photoelectric conversion element according to a third modification of the first embodiment. As shown in FIG. 11, in the second photoelectric conversion element 20, the insulating layer 235 may be provided between the n-type (second conductivity type) semiconductor layer 231 and the transparent electrode layer (second electrode layer) 232. In this case, for example, after an insulating layer is formed on the n-type semiconductor layer 231, the pin holes 25 are formed, and the insulating layer 235 is obtained. After this, the transparent electrode layer 232 is formed on the insulating layer 235. Thus, the pin holes 25 are filled with the material of the transparent electrode layer 232. In this modification, the insulating layer 235 is provided in contact with the transparent electrode layer 232 having the second highest resistance out of the passivation layer 230, the n-type semiconductor layer 231 and the transparent electrode layer 232 on the back surface side of the second photoelectric conversion element 20, and the pin holes 25 in the insulating layer 235 are filled with the material of the transparent electrode layer 232 and has high resistance. Thus, a change in the output current of the second photoelectric conversion element 20 according to the spot size of incident light becomes greater.

In the second photoelectric conversion element 20, an insulating layer and pin holes may be provided in at least one of a part between the n-type (second conductivity type) semiconductor layer 231 and the transparent electrode layer (second electrode layer) 232 on the back surface side of the semiconductor substrate 210 and a part between the p-type (first conductivity type) semiconductor layer 221 and the transparent electrode layer (first electrode layer) 222 on the light receiving surface side of the semiconductor substrate 210.

(Fourth Modification)

Figure 12:
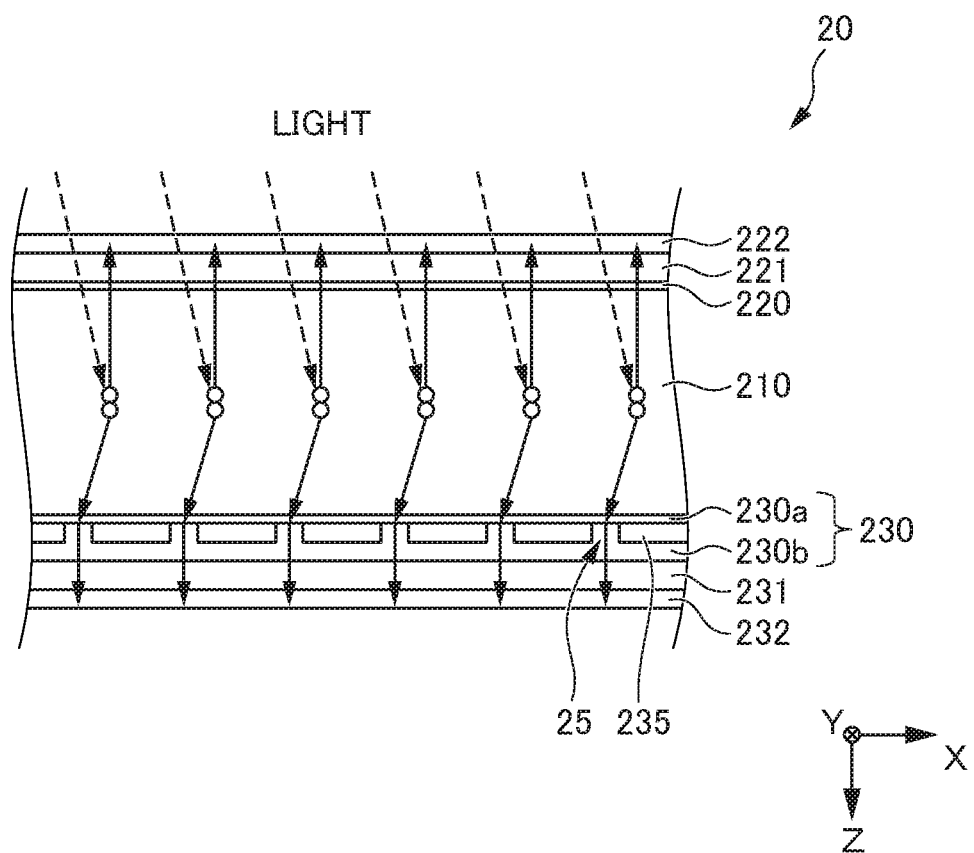
FIG. 12 is a schematic view showing the state of the recovery of carriers generated in a semiconductor substrate when an irradiation region is large in a second photoelectric conversion element according to a fourth modification of the first embodiment.
Figure 13:
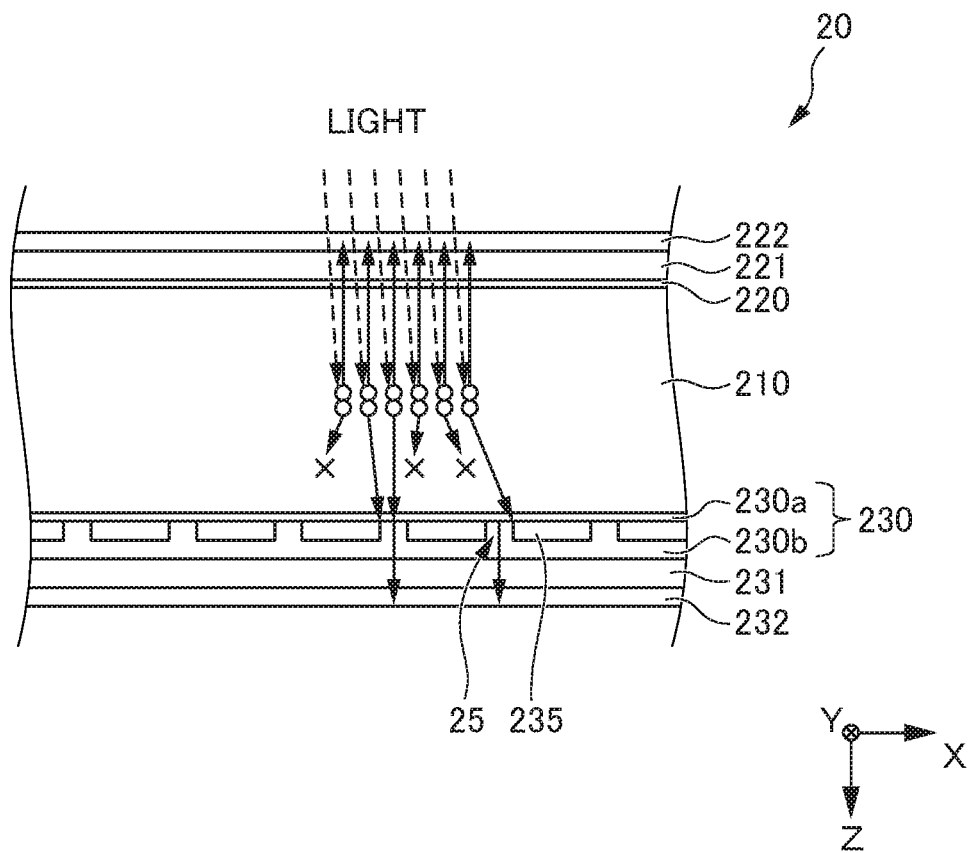
FIG. 13 is a schematic view showing the state of the recovery of carriers generated in the semiconductor substrate when the irradiation region is small in the second photoelectric conversion element according to the fourth modification of the first embodiment.

FIG. 12 is a schematic view showing the state of the recovery of carriers generated in the semiconductor substrate 210 when the irradiation region R is large in a second photoelectric conversion element according to a fourth modification of the first embodiment, and FIG. 13 is a schematic view showing the state of the recovery of carriers generated in the semiconductor substrate 210 when the irradiation region R is small in the second photoelectric conversion element according to the fourth modification of the first embodiment. As shown in FIGS. 12 and 13, in the second photoelectric conversion element 20, the passivation layer (second passivation layer) 230 may be thinner. For example, the thickness of the division layer 230a closer to the semiconductor substrate 210 side than the insulating layer 235 in the passivation layer 230 is preferably smaller than the thickness of the division layer 230b closer to the n-type semiconductor layer 231 side than the insulating layer 235 in the passivation layer 230. The thickness of the division layer 230a is preferably less than 2 nm. If the passivation layer 230 is thinned, the effect of suppressing the recombination of carriers generated in the semiconductor substrate 210 is reduced. Therefore, when the irradiation region R is small as shown in FIG. 13 (when the density of incident light is high), i.e., when the density of carriers generated in the semiconductor substrate 210 is high, the recovery of carriers takes time, and carriers are recombined if the carriers are congested in the pin holes 25 (marks x in FIG. 13). On the other hand, when the irradiation region R is large as shown in FIG. 12 (when the density of incident light is low), i.e., when the density of carriers generated in the semiconductor substrate 210 is low, the carriers are not congested in the pin holes 25, and the recovery of carriers therefore does not take time, and the recombination of carriers is suppressed. Thus, a change in the output current of the second photoelectric conversion element 20 according to the spot size of incident light becomes still greater.

In this instance, the thickness of the passivation layer (first passivation layer) 220 is also preferably as small as the thickness of the division layer 230a in the passivation layer 230. Thus, a change in the output current of the second photoelectric conversion element 20 according to the spot size of incident light becomes still greater. Similarly, when the insulating layer 225 including the pin holes 25 is formed in an intermediate part of the passivation layer 220 as in the first modification shown in FIG. 9, the thickness of the division layer 220a closer to the semiconductor substrate 210 side than the insulating layer 225 in the passivation layer 220 may be smaller than the thickness of the division layer 220b closer to the p-type semiconductor layer 221 side than the insulating layer 225 in the passivation layer 220. The thickness of the division layer 220a is preferably less than 2 nm.

(Fifth Modification)

Figure 14:
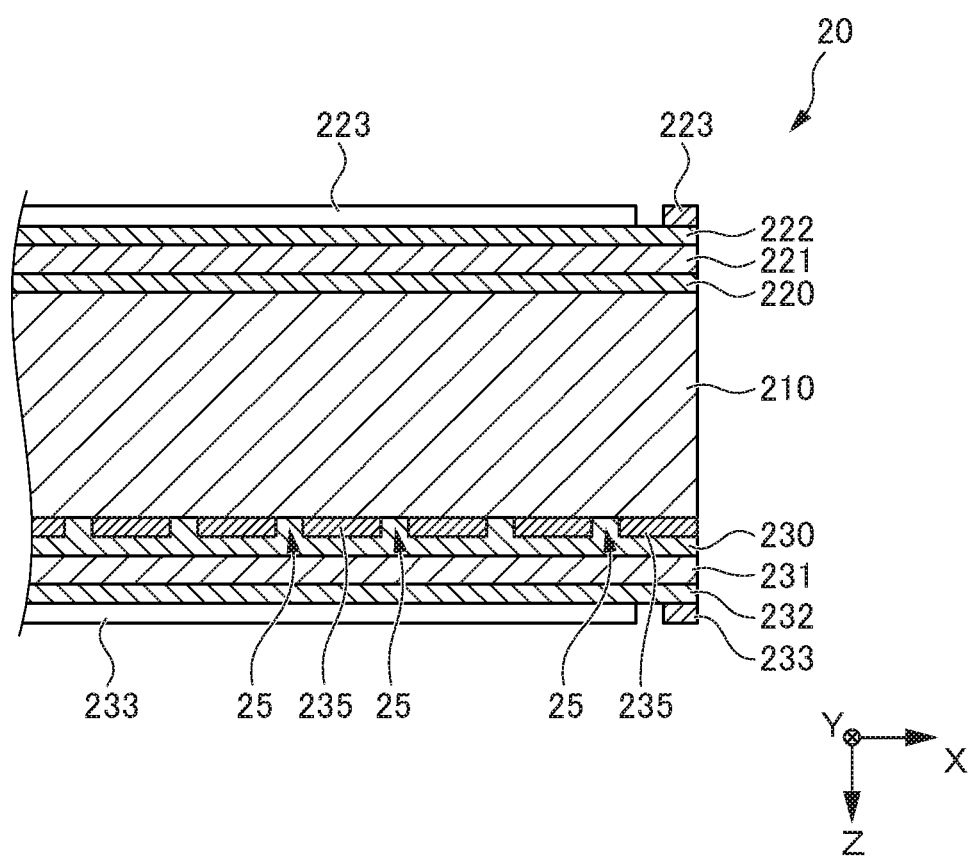
FIG. 14 is a sectional view of a second photoelectric conversion element according to a fifth modification of the first embodiment.

FIG. 14 is a sectional view of a second photoelectric conversion element according to a fifth modification of the first embodiment. As shown in FIG. 14, in the second photoelectric conversion element 20, the insulating layer 235 may be provided between the semiconductor substrate 210 and the passivation layer (second passivation layer) 230. In other words, in the second photoelectric conversion element 20 according to the first embodiment shown in FIG. 3, the division layer 230a in the passivation layer 230 may not be formed. In this case, for example, after an insulating layer is formed on the semiconductor substrate 210, the pin holes 25 are formed, and the insulating layer 235 is obtained. After this, the passivation layer 230 is formed on the insulating layer 235. Thus, the pin holes 25 are filled with the material of the passivation layer 230.

Similarly, when the insulating layer 225 is formed in addition to the insulating layer 235 as in the first modification shown in FIG. 9, the insulating layer 225 may be provided between the semiconductor substrate 210 and the passivation layer (first passivation layer) 220. In other words, the division layer 220a in the passivation layer 220 may not be formed.

While the first embodiment and the first to fifth modifications have been described above, the second photoelectric conversion element 20 is not limited to these embodiments, and various modifications and combinations may be made. For example, when the insulating layer 225 (pin holes 25) and the insulating layer 235 (pin holes 25) are formed on both the light receiving surface side and back surface side of the semiconductor substrate 210 as in the first modification shown in FIG. 9, the arrangement of the insulating layer 225 (pin holes 25) on the light receiving surface side and the arrangement of the insulating layer 235 (pin holes 25) on the back surface side may be varied by suitably modifying and combining the first embodiment and the first to fifth modifications.

(Second Embodiment)

Optical sensors include a three-dimensional sensor that detects a position in a Z direction (depth) in addition to positions in X and Y directions (XY position) of a subject by causing diffused light from the subject to be incident thereon. In such a three-dimensional sensor, if the position of the subject in the Z direction (depth) changes, the spot size of incident light incident on a photoelectric conversion element inside changes (defocusing).

Accordingly, if the aforementioned photoelectric conversion device 1 is applied to such a three-dimensional sensor, the position of the subject in the Z direction (depth) can be detected by detecting the spot size of incident light incident on the photoelectric conversion. The three-dimensional position of the subject can be detected from the incident direction of the incident light and the position in the Z direction (depth).

FIG. 15 is a view showing the configuration of a three-dimensional sensor according to a second embodiment. A three-dimensional sensor 2 shown in FIG. 15 includes an optical lens 50 for condensing an optical image (diffused light) emitted from a subject, for example, by irradiating laser light to the subject, and the aforementioned photoelectric conversion device 1 on which the condensed light from the optical lens 50 is incident, i.e., the first photoelectric conversion element 10, the second photoelectric conversion element 20, the storage 30 and the calculator 40.

In this embodiment, the first photoelectric conversion element 10 is arranged on the focus position of the optical lens 50. The first photoelectric conversion element 10 generates a current corresponding to the intensity (total amount) of focused incident light incident on the light receiving surface. The first photoelectric conversion element 10 distributes and outputs the generated current to four electrode layers 123 (133) arranged on the four sides according to the XY position (coordinates) of the center of the incident light on the light receiving surface (XY plane). The first photoelectric conversion element 10 also transmits the incident light.

The second photoelectric conversion element 20 generates a current corresponding to a carrier amount passing through the plurality of pin holes (through-holes) 25 two-dimensionally provided along the light receiving surface (XY plane) out of carriers (electrons or holes) generated according to defocused incident light incident on the light receiving surface. In this way, the second photoelectric conversion element 20 generates a current corresponding to the density of the incident light, i.e. a current corresponding to the spot size of the incident light. The second photoelectric conversion element 20 distributes and outputs the generated current to the four electrode layers 223 (233) arranged on four sides according to the XY position (coordinates) of the center of the incident light on the light receiving surface (XY plane).

The storage 30 stores in advance a table associating an output current (total amount) of the first photoelectric conversion element 10 (i.e. a current corresponding to the intensity (total amount) of incident light) and an output current (total amount) of the second photoelectric conversion element 20 (i.e. a current corresponding to the spot size of the incident light) with the spot size of the incident light on the light receiving surface of the second photoelectric conversion element 20, and further associating the position of the subject in the Z direction (depth) with this spot size.

As described above, the calculator 40 calculates and detects the intensity (total amount) of the incident light according to the total amount of currents output from the four electrode layers 123 (133) of the first photoelectric conversion element 10. As described above, the calculator 40 also calculates and detects the XY position (coordinates) of the incident light on the light receiving surface of the first photoelectric conversion element 10 based on a ratio of the currents output from each of the four electrode layers 123 (133) of the first photoelectric conversion element 10. Similarly, the calculator 40 calculates and detects the XY position (coordinates) of the incident light on the light receiving surface of the second photoelectric conversion element 20 based on a ratio of the currents respectively output from the four electrode layers 223 (233) of the second photoelectric conversion element 20. The calculator 40 calculates and detects an incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30 and obtains and detects the spot size of the incident light on the light receiving surface of the second photoelectric conversion element 20 corresponding to the total amount of the currents output from the first photoelectric conversion element 10 (i.e. a current corresponding to the intensity (total amount) of the incident light) and the total amount of the currents output from the second photoelectric conversion element 20 (i.e. a current corresponding to the spot size of the incident light), and the position of the subject in the Z direction (depth). The calculator 40 detects the three-dimensional position of the subject from the incident direction of the incident light detected as described above and the position in the Z direction (depth).

Although the embodiments of the present disclosure have been described above, the present disclosure is not limited to the above embodiments and various modifications can be made. For example, although the hetero-junction type photoelectric conversion elements 10, 20 have been illustrated as shown in FIGS. 2 and 3 in the above embodiments, the features of the present disclosure are not limited to hetero-junction type photoelectric conversion elements and are applicable to various photoelectric conversion elements such as homo-junction type photoelectric conversion elements.

In the above embodiments, p-type semiconductor layers have been illustrated as the conductivity type semiconductor layers 121, 221 on the light receiving surface side and n-type semiconductor layers have been illustrated as the conductivity type semiconductor layers 131, 231 on the back surface side. However, the conductivity type semiconductor layer 121, 221 on the light receiving surface side may be an n-type semiconductor layer in which an amorphous silicon material is doped with an n-type dopant (e.g. phosphorus (P) described above), and the conductivity type semiconductor layer 131, 231 on the back surface side may be a p-type semiconductor layer in which an amorphous silicon material is doped with a p-type dopant (e.g. boron (B) described above).

Although an n-type semiconductor substrate has been illustrated as the semiconductor substrate 110, 210 in the above embodiments, the semiconductor substrate 110, 210 may be a p-type semiconductor substrate in which a crystalline silicon material is doped with a p-type dopant (e.g. boron (B) described above).

Although the photoelectric conversion elements each including the crystalline silicon substrate have been illustrated in the above embodiments, there is no limitation to this. For example, the photoelectric conversion element may include a gallium arsenide (GaAs) substrate.

What is claimed is:

1. A photoelectric conversion element comprising:
a photoelectric conversion substrate having first and second principal surfaces, a first conductivity type semiconductor layer and a first electrode layer successively laminated on the first principal surface, and a second conductivity type semiconductor layer and a second electrode layer successively laminated on the second principal surface;
an insulating layer disposed between at least one of
the photoelectric conversion substrate and the first electrode layer; and
the photoelectric conversion substrate and the second electrode layer,
the insulating layer having a plurality of through-holes, such that the plurality of through-holes are distributed two-dimensionally along the first principal surface when the insulating layer is disposed between the photoelectric conversion substrate and the first electrode layer and are distributed two-dimensionally along the second principal surface when the insulating layer is disposed between the photoelectric conversion substrate and the second electrode layer;
a first passivation layer disposed between the photoelectric conversion substrate and the first conductivity type semiconductor layer; and
a second passivation layer disposed between the photoelectric conversion substrate and the second conductivity type semiconductor layer, wherein
the insulating layer is disposed in at least one of an intermediate part of the first passivation layer in a lamination direction of the photoelectric conversion element and an intermediate part of the second passivation layer in the lamination direction.

2. The photoelectric conversion element according to claim 1, wherein
at least one of
a thickness of the first passivation layer closer to the photoelectric conversion substrate side than the insulating layer is smaller than a thickness of the first passivation layer closer to the first conductivity type semiconductor layer side than the insulating layer, and
a thickness of the second passivation layer closer to the photoelectric conversion substrate side than the insulating layer is smaller than a thickness of the second passivation layer side closer to the second conductivity type semiconductor layer than the insulating layer.

3. A photoelectric conversion device comprising:
a photoelectric conversion element comprising
a photoelectric conversion substrate having first and second principal surfaces, a first conductivity type semiconductor layer and a first electrode layer successively laminated on the first principal surface, and a second conductivity type semiconductor layer and a second electrode layer successively laminated on the second principal surface; and
an insulating layer disposed between at least one of
the photoelectric conversion substrate and the first electrode layer; and
the photoelectric conversion substrate and the second electrode layer,
the insulating layer having a plurality of through-holes, such that the plurality of through-holes are distributed two-dimensionally along the first principal surface when the insulating layer is disposed between the photoelectric conversion substrate and the first electrode layer and are distributed two-dimensionally along the second principal surface when the insulating layer is disposed between the photoelectric conversion substrate and the second electrode layer;
an other photoelectric conversion element arranged on an upstream side of incident light that is incident on the first principal surface of the photoelectric conversion element; and
a calculator configured to calculate a spot size of the incident light on the photoelectric conversion element based on an output current of the other photoelectric conversion element and an output current of the photoelectric conversion element.

4. The photoelectric conversion device according to claim 3, further comprising
a first passivation layer disposed between the photoelectric conversion substrate and the first conductivity type semiconductor layer, and
a second passivation layer disposed between the photoelectric conversion substrate and the second conductivity type semiconductor layer, wherein
the insulating layer is disposed between at least one of
the first passivation layer and the first conductivity type semiconductor layer; and
the second passivation layer and the second conductivity type semiconductor layer.

5. The photoelectric conversion device according to claim 3, wherein
the insulating layer is disposed between at least one of
the first conductivity type semiconductor layer and the first electrode layer; and
the second conductivity type semiconductor layer and the second electrode layer.

6. A photoelectric conversion device comprising:
an other photoelectric conversion element arranged on an upstream side of incident light that is incident on the first principal surface of the photoelectric conversion element according to claim 1.

7. The photoelectric conversion device according to claim 6, further comprising
a calculator configured to calculate a spot size of the incident light on the photoelectric conversion element based on an output current of the other photoelectric conversion element and an output current of the photoelectric conversion element.

8. The photoelectric conversion device according to claim 3, further comprising
a first passivation layer disposed between the photoelectric conversion substrate and the first conductivity type semiconductor layer, and
a second passivation layer disposed between the photoelectric conversion substrate and the second conductivity type semiconductor layer, wherein
the insulating layer is disposed between at least one of
the photoelectric conversion substrate and the first passivation layer; and the photoelectric conversion substrate and the second passivation layer.

9. The photoelectric conversion element according to claim 3, further comprising
a first passivation layer disposed between the photoelectric conversion substrate and the first conductivity type semiconductor layer, and
a second passivation layer disposed between the photoelectric conversion substrate and the second conductivity type semiconductor layer, wherein
wherein
the insulating layer is disposed between at least one of
the first conductivity type semiconductor layer and the first electrode layer; and
the second conductivity type semiconductor layer and the second electrode layer.

10. A photoelectric conversion device comprising:
an other photoelectric conversion element arranged on an upstream side of incident light that is incident on the first principal surface of the photoelectric conversion element according to claim 2.

11. The photoelectric conversion device according to claim 10, further comprising
a calculator configured to calculate a spot size of the incident light on the photoelectric conversion element based on an output current of the other photoelectric conversion element and an output current of the photoelectric conversion element.

* * * * *